United States Patent
Jungerman et al.

(10) Patent No.: US 7,924,959 B2
(45) Date of Patent: Apr. 12, 2011

(54) DATA CONVERSION SYSTEM

(75) Inventors: Roger Lee Jungerman, Petaluma, CA (US); Kenneth R. Wildnauer, Santa Rosa, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 1232 days.

(21) Appl. No.: 11/428,649

(22) Filed: Jul. 5, 2006

(65) Prior Publication Data

US 2008/0007437 A1     Jan. 10, 2008

(51) Int. Cl.
*H04L 7/00* (2006.01)
(52) U.S. Cl. ........ 375/354; 375/316; 375/350; 341/115; 341/118; 341/155; 341/126
(58) Field of Classification Search .................. 375/354, 375/316, 350; 341/115, 118, 155, 126
See application file for complete search history.

(56) References Cited

U.S. PATENT DOCUMENTS

| | | | | |
|---|---|---|---|---|
| 5,272,656 A | * | 12/1993 | Genereux | 708/322 |
| 5,440,756 A | * | 8/1995 | Larson | 704/278 |
| 6,060,914 A | * | 5/2000 | Nunokawa | 327/91 |
| 6,222,477 B1 | * | 4/2001 | Irie et al. | 341/161 |
| 6,342,850 B1 | * | 1/2002 | Borer et al. | 341/156 |
| 2003/0058148 A1 | * | 3/2003 | Sheen | 341/155 |
| 2003/0080890 A1 | * | 5/2003 | Hilton | 341/155 |
| 2004/0128076 A1 | * | 7/2004 | Pupalaikis et al. | 702/16 |

* cited by examiner

*Primary Examiner* — Chieh M Fan
*Assistant Examiner* — Leila Malek

(57) ABSTRACT

A data conversion system acquires samples of low frequency signal components of an applied analog signal at a first data conversion rate and samples of high frequency signal components of the applied analog signal at a second data conversion rate that is higher than the first data conversion rate. The data conversion system applies a first correction filter to the acquired samples of the low frequency signal components to provide a first filtered signal and applies a second correction filter to the acquired samples of the high frequency signal components to provide a second filtered signal. The data conversion system interpolates the first filtered signal to provide an interpolated signal, and sums the interpolated signal with the second filtered signal to provide an output signal.

8 Claims, 4 Drawing Sheets

Figure 1 *(Prior Art)*

DATA CONVERSION SYSTEM

BACKGROUND

Data converters are included in many types of instruments and systems to provide digital representations of signals that are applied to the data converters. For example, a data converter provides digital samples of applied input signals that can be processed to represent the signals on a display or other output device.

The measurement bandwidth and measurement sensitivity of a conventional data converter are typically limited by the bandwidth and the dynamic range, respectively, of an amplifier and an analog-to-digital converter (ADC) within the data converter (shown in FIG. 1). Accordingly, to improve these performance parameters, there is a need for a data converter that has a wide bandwidth and high dynamic range, that is also suitable for inclusion in a variety of instruments or systems. There is also a need in data acquisition systems for data converters that can acquire samples of applied input signals over an operating frequency range that extends from DC to greater than 10 Gigahertz, for example, which can be difficult to achieve using conventional data converters.

DETAILED DESCRIPTION

Figure 1:
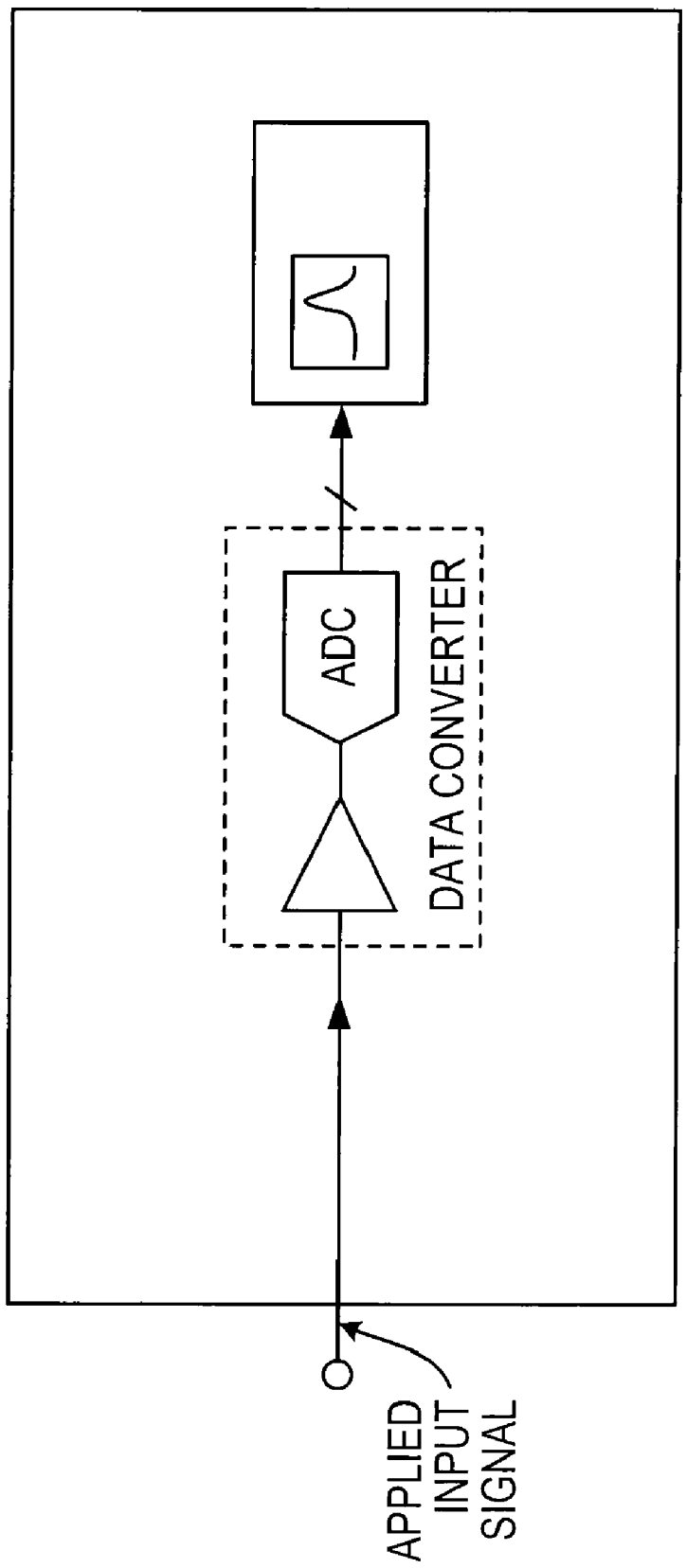
FIG. 1 shows a conventional data converter.
Figure 2:
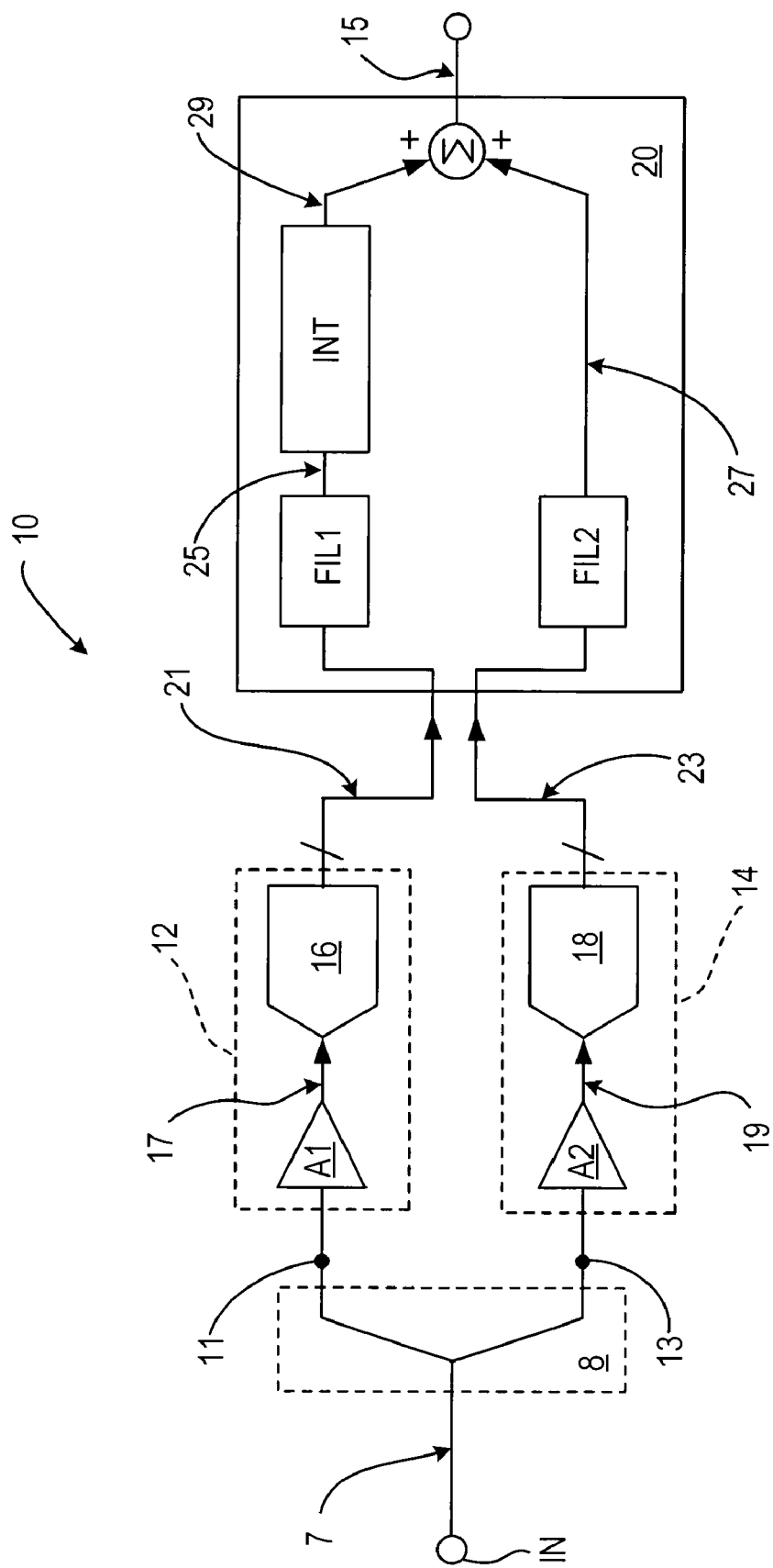
FIG. 2 shows an example of a data conversion system according to embodiments of the present invention.

FIG. 2 shows an example of a data conversion system 10 according to embodiments of the present invention. The data conversion system 10 includes a signal splitter 8 that is coupled to a first data converter 12 and a second data converter 14. The first data converter 12 and the second data converter 14 are coupled to a signal processor 20 that provides an output signal 15. The output signal 15 provides a digital representation of an analog signal 7 that is applied to an input IN of the data conversion system 10.

The signal splitter 8 provides a signal path between the input IN and a first output 11, and a signal path between the input IN and the second output 13. The signal splitter 8 is typically implemented with lumped circuit elements, such as resistors, capacitors, or inductors, or with transmission line structures or other distributed elements, or with a combination of lumped circuit elements and distributed elements. The signal splitter 8 is alternatively implemented using amplifiers, active filters, or other active devices, elements, or systems.

In the example shown in FIG. 2, the signal splitter 8 and data converters 12, 14 provide a frequency crossover network that results in a low frequency signal path between the input IN and the first data converter 12, and a high frequency signal path between the input IN and the second data converter 14. To minimize insertion loss in the high frequency signal path, the low frequency signal path is designated to have a higher characteristic impedance than the high frequency signal path between the input IN and the data converter 14. In one example, the high frequency signal path has a characteristic impedance of 50 Ohms, whereas the low frequency signal path has a characteristic impedance of 1 kOhm.

In the example shown in FIG. 2, the data converter 12 includes a low frequency amplifier A1, and the data converter 14 includes a high frequency amplifier A2. Accordingly, the combination of the signal splitter 8 and the low frequency amplifier A1 provide a lowpass frequency response in the low frequency signal path. The combination of the signal splitter 8 and the high frequency amplifier A2 provide a highpass frequency response in the high frequency signal path.

The low frequency amplifier A1 is typically implemented with a silicon operational amplifier, whereas the high frequency amplifier A2 is typically implemented with a gallium arsenide amplifier. Relative to a gallium arsenide amplifier, a silicon operational amplifier provides for lower offset voltages and offset currents, and for lower drifts in the offset voltages and offset currents, which result in accurate amplification of low level signals and a high level of low frequency performance stability. A silicon operational amplifier generally provides for lower 1/f noise, a common measure of low frequency noise, than a gallium arsenide amplifier. The 1/f noise of a gallium arsenide amplifier can limit the dynamic range of a data conversion system were the gallium arsenide amplifier used in the low frequency signal path.

In addition, silicon operational amplifiers are typically operated in a gain-stabilized feedback configuration, providing a designated gain with low distortion, within an operating frequency range that, in one example, can extend from DC to approximately 40 MHz. The above performance parameters of silicon operational amplifiers typically degrade at frequencies beyond the operating frequency range. When used to implement the low frequency amplifier A1, the silicon operational amplifier provides for low-noise, accurate amplification of signals that are present at the output 11, within a designated operating frequency range that is generally lower for silicon operational amplifiers than for gallium arsenide amplifiers. In addition, silicon operational amplifiers typically have high input impedance, which makes the silicon operational amplifiers well-suited for coupling to the high characteristic impedance of the low frequency signal path in the data conversion system 10. One example of a silicon operational amplifier suitable for implementing the low frequency amplifier A1, is a TEXAS INSTRUMENTS model THS4271 amplifier, which provides an input impedance of 5 MOhm, and an operating frequency range that extends from DC to approximately 40 MHz.

Relative to silicon operational amplifiers, gallium arsenide amplifiers provide for accurate amplification over a higher operating frequency range. Gallium arsenide amplifiers are typically AC coupled, providing low distortion amplification of signals that are present at the second output 13 over an operating frequency range that, in one example, extends from approximately 10 MHz to above 1 GHz. Gallium arsenide amplifiers are typically designed to have low input impedances. For example, an input impedance of 50 Ohms results in an impedance match to the relatively low characteristic impedance of the high frequency signal path of the data conversion system 10. One example of a gallium arsenide amplifier that is suitable for implementing the high frequency amplifier A2 is a model AMMC 5024 amplifier, provided by AVAGO TECHNOLOGIES, Inc.

The data converter 12 includes an analog-to-digital converter (ADC) 16 cascaded with the low frequency amplifier A1, and the data converter 14 includes an ADC 18 cascaded with the high frequency amplifier A2. In the example shown in FIG. 2, the low frequency amplifier A1 and the high frequency amplifier A2 are separate from the corresponding ADCs 16, 18. In alternative examples, one or both of the amplifiers A1, A2 are integrated into the corresponding ADCs 16, 18, or one or both of the amplifiers A1, A2 are omitted from the corresponding data converters 12, 14.

The ADC 16 has a lower data conversion rate than the ADC 18, and the ADC 16 is optimized to have higher resolution and higher dynamic range than the ADC 18. The ADC 18 has a higher data conversion rate than the ADC 16, enabling the ADC 18 to operate at higher frequencies than the ADC 16. In one example, the ADC 16 has 14 bits of resolution and dynamic range and a data conversion rate of 100 mega-samples per second, whereas the ADC 18 has 12 bits of resolution and dynamic range, with a data conversion rate that is higher than 100 mega-samples per second. The ADCs 16, 18 can be implemented with signal samplers, data acquisition systems or any of a variety of types of analog-to-digital converters.

When the analog signal 7 is applied to the input IN of the data conversion system 10, low frequency components 17 of the analog signal 7 within a first, lower frequency range are amplified by the low frequency amplifier A1 and provided to the first data converter 12. The first data converter 12 acquires samples of the low frequency components 17 of the analog signal 7 at a first data conversion rate. High frequency components 19 of the analog signal 7 within a second, higher frequency range are amplified by the high frequency amplifier A2 and provided to the second data converter 14. The second data converter 14 acquires samples of the high frequency components 19 of the analog signal 7 at a second data conversion rate that is higher than the first data conversion rate. The operating frequency range of the low frequency signal path of the data conversion system 10 is typically defined by at least one of the operating frequency range of the low frequency amplifier A1, the frequency response of the signal splitter 8 between the input IN and the output 11, and the data conversion rate of the ADC 16. The operating frequency range of the high frequency signal path of the data conversion system 10 is typically defined by at least one of the operating frequency range of the high frequency amplifier A2, the frequency response of the signal splitter 8 between the input IN and the output 13, and the data conversion rate of the ADC 18.

The acquired samples of the low frequency components 17 of the analog signal 7 are provided by the ADC 16 to the signal processor 20 in the form of a first digital signal 21. Acquired samples of the high frequency components 19 of the analog signal 7 are provided by the ADC 18 to the signal processor 20 in the form of a second digital signal 23. The signal processor 20 processes the first digital signal 21 and the second digital signal 23 to provide the output signal 15, which is a digital representation of the analog signal 7 that is applied to the input IN of the data conversion system 10.

Processing the first digital signal 21 includes first measuring the transfer function between the input IN of the signal splitter 8 and the ADC 16, and establishing a first correction filter FIL1 that is applied to the first digital signal 21. Processing the second digital signal 23 includes first measuring the transfer function between the input IN of the signal splitter 8 and the ADC 18, and establishing a second correction filter FIL2 that is applied to the second digital signal 23. The transfer function between the input IN and the ADC 16 includes the amplitude and phase response of the signal path between the input IN of the diplexer 8 and the ADC 16, whereas the transfer function between the input IN and the ADC 18 includes the amplitude and phase response of the signal path between the input IN of the signal splitter 8 and the ADC 18.

Figure 3:
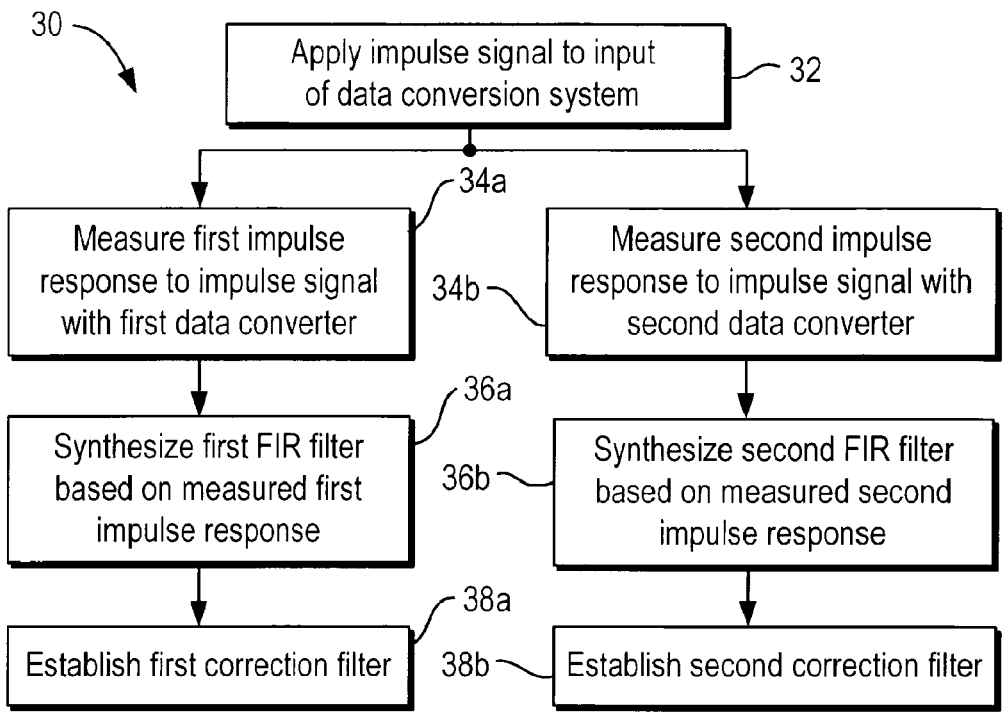
FIG. 3 shows an example of a processing method within the data conversion system according to embodiments of the present invention.

One example of the processing provided by the signal processor 20 is illustrated by a processing method 30 shown in FIG. 3. Step 32 of the method 30 includes applying an impulse signal to the input IN of the data conversion system 10. Step 34a includes measuring a first impulse response to the impulse signal with the data converter 12, and step 34b includes measuring a second impulse response to the impulse signal with the data converter 14. The measured first impulse response represents the transfer function between the input IN and the ADC 16 in the time domain. A Fourier Transform of the measured first impulse response represents the transfer function between the input IN and the ADC 16 in the frequency domain. The measured second impulse response represents the transfer function between the input IN and the ADC 18 in the time domain. A Fourier Transform of the measured second impulse response represents the transfer function between the input IN and the ADC 18 in the frequency domain.

The measured first impulse response and the measured second impulse response are applied to the signal processor 20 or to a computer, DSP or other processing unit internal or external to the data conversion system 10. For the purpose of illustration, an example is provided wherein the measured first and second impulse responses are provided to the signal processor 20 that is included in the data conversion system 10.

The signal processor 20 receives the measured first impulse response and synthesizes a first finite impulse response (FIR) filter FIR1 based on the measured first impulse response in step 36a. The signal processor 20 receives the measured second impulse response and synthesizes a second FIR filter FIR2 based on the measured second impulse response in step 36b. Synthesizing the FIR filter FIR1 and the FIR filter FIR2 is illustrated in the context of FIGS. 4A-4C, which show examples of various response characteristics associated with the data conversion system 10.

Figure 4A:
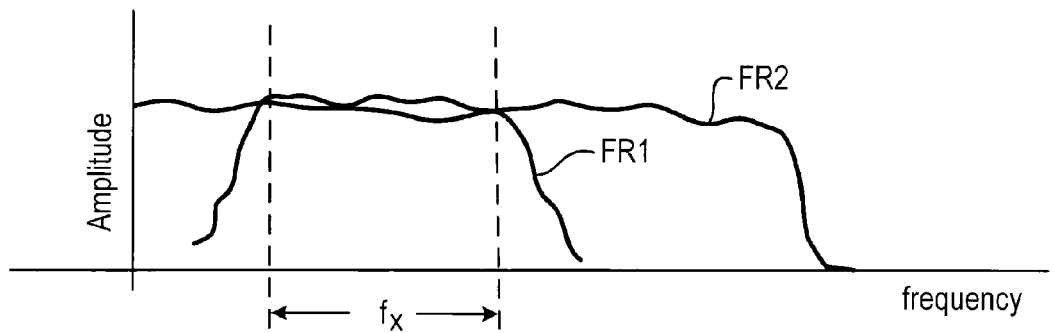
FIGS. 4A-4C show examples of response characteristics associated with the data conversion system according to embodiments of the present invention.

FIG. 4A shows a superposition of a Fourier Transform of the measured first impulse response (indicated as measured frequency response FR1) and a Fourier Transform of the measured second impulse response (indicated as measured frequency response FR2). FIG. 4A also shows a frequency cross-over region fx, within which the measured frequency response FR1 and the measured second frequency response FR2 have overlapping passbands.

Figure 4B:
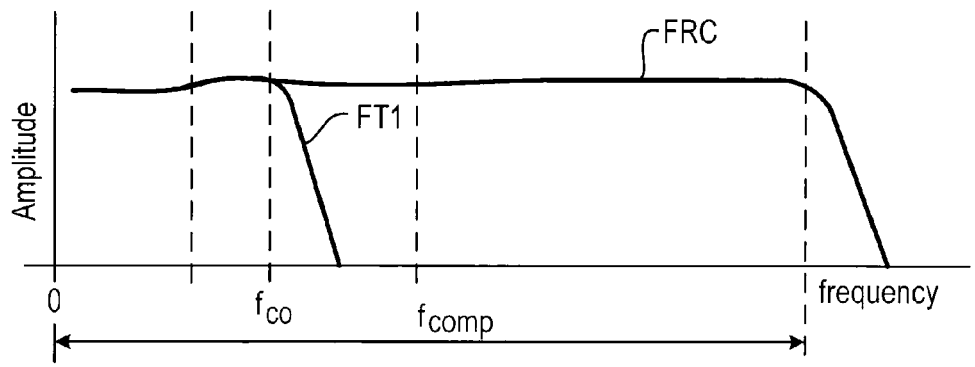

FIG. 4B shows a target composite frequency response FRC for the data conversion system 10. The target composite frequency response FRC has constant amplitude and constant phase over a frequency range fcomp. For clarity, the phase of the target composite frequency response FRC is not shown in FIG. 4B. FIG. 4B also shows a target frequency response FT1 for the first FIR filter FIR1, superimposed on the target composite frequency response FRC. The target frequency response FT1 for the first FIR filter FIR1 has a passband that coincides with the composite frequency response FRC up to a cut-off frequency fco of the target frequency response FT1. The cut-off frequency fco of the target frequency response FT1 is positioned within the frequency cross-over region fx shown in FIG. 4A.

Figure 4C:
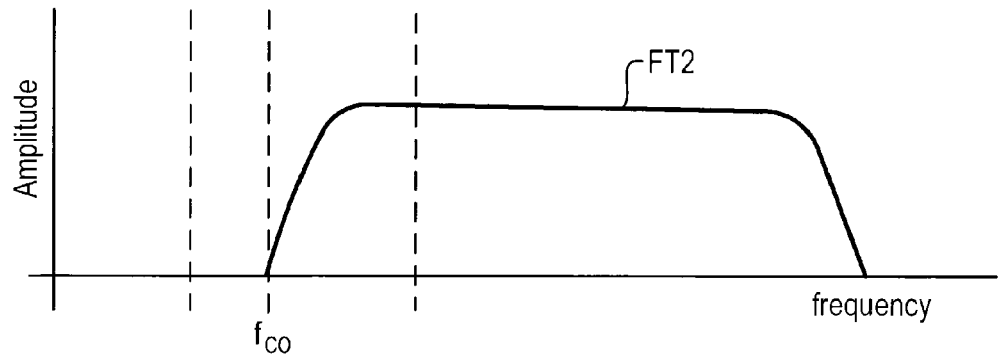

FIG. 4C shows an example of a target frequency response FT2 for the FIR filter FIR2. In this example, the target filter response FT2 for the FIR filter FIR2 is obtained by subtracting the target frequency response FT1 for the FIR filter FIR1 from the target composite frequency response FRC.

The FIR filter FIR1 can be synthesized from the target frequency response FT1 using conventional filter synthesis techniques. Typically, the synthesis includes designating a sufficient number of taps to establish a passband response, the cut-off frequency fco within the frequency cross-over region fx, and a stopband response as designated in the target filter response FT1. The FIR filter FIR2 can also be synthesized from the target frequency response FT2 using conventional filter synthesis techniques, typically by designating a sufficient number of taps to establish a frequency response sufficiently close to the target filter response FT2. For example, filter synthesis functions in MATLAB, provided by MATH-WORKS, INC., can be used to synthesize FIR filters with a specified number of taps and target frequency responses.

The signal processor 20 establishes the first correction filter FIL1 in step 38a. In one example, the first correction filter FIL1 is established by the ratio of the frequency response of the FIR filter FIR1 to the measured frequency response FR1, which results in a frequency domain representation of the first correction filter FIL1. In an alternative example, a time domain representation of the first correction filter FIL1 is established from an inverse Fourier Transform of the frequency domain representation of the first correction filter FIL1. The signal processor 20 establishes the second correction filter FIL2 in step 38b. In one example, the second correction filter FIL2 is established by the ratio of the frequency response of the FIR filter FIR2 to the measured frequency response FR2, which results in a frequency domain representation of the second correction filter FIL2. In an alternative example, a time domain representation of the second correction filter FIL2 is established from an inverse Fourier Transform of the frequency domain representation of the second correction filter FIL2.

The signal processor 20 accommodates for the transfer function between the input IN and the ADC 16 by applying the first correction filter FIL1 to subsequent digital signals 21 provided by the data converter 12 to provide a filtered digital signal 25. The signal processor 20 accommodates for the transfer function between the input IN and the ADC 18 by applying a second correction filter FIL2 to subsequent digital signals 23 provided by the data converter 18 to provide a filtered digital signal 27.

Applying the first correction filter to the digital signals 21 to provide the filtered digital signal 25 is performed in the time domain typically by convolving the time domain representation of the first correction filter FIL1 with a time domain representation of the digital signal 21. Applying the first correction filter FIL1 to the digital signals 21 to provide the filtered digital signal 25 is performed in the frequency domain typically by multiplying a frequency domain representation of the first correction filter with a frequency domain representation of the digital signal 21, typically obtained from a Fast Fourier Transform (FFT) of the digital signal 21.

Applying the second correction filter to the second digital signal 23 to provide the filtered digital signal 27 is performed in the time domain typically by convolving the time domain representation of the second correction filter FIL2 with a time domain representation of the digital signal 23. Applying the second correction filter FIL2 to the digital signals 23 to provide the filtered digital signal 27 is performed in the frequency domain typically by multiplying a frequency domain representation of the second correction filter FIL2 with a frequency domain representation of the digital signal 23, typically obtained from a Fast Fourier Transform (FFT) of the digital signal 23.

In one example of the data conversion system 10, the signal processor 20 also accommodates for the difference between the first data conversion rate of the data converter 12 and the second data conversion rate of the data converter 14. To provide this accommodation, the signal processor 20 typically interpolates between the samples in the filtered digital signal 27 occurring at the first data conversion rate of the ADC 16 to provide a digital signal 29 with an effective data conversion rate equal to that of the second data conversion rate of the ADC 18. In FIG. 2, an interpolator INT is shown included in the signal processor 20 to reconcile the difference between the first data conversion rate of the data converter 12 and the second data conversion rate of the data converter 14. In an example wherein the second data conversion rate is 100 times the first data conversion rate, an interpolation factor of 100 reconciles the difference in the data conversion rates between the ADC 16 and the ADC 18.

The signal processor 20 combines the digital signal 29 with the filtered digital signal 27 to provide the output signal 15. The output signal 15 provides a digital representation of the analog signal 7 having a bandwidth that is the sum of the operating bandwidth provided by the low frequency signal path between the input IN and the ADC 16 and the operating bandwidth provided by the high frequency signal path between the input IN and the ADC 18.

Figure 5:
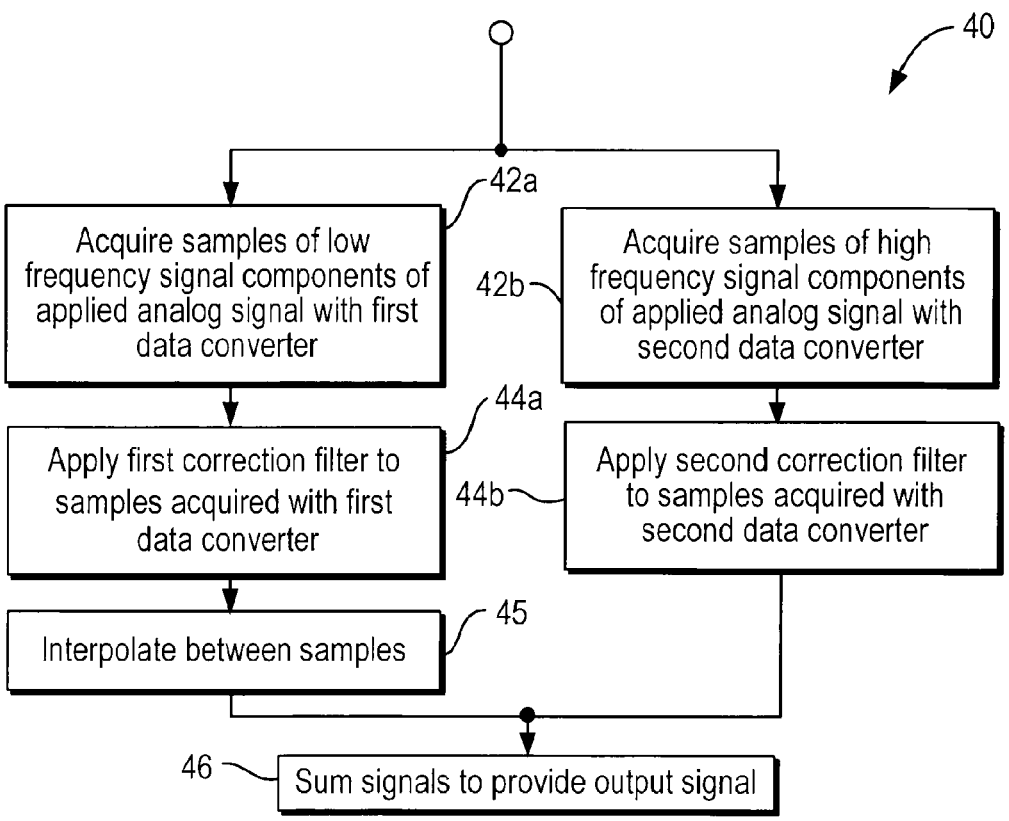
FIG. 5 shows an example of the data conversion system according to alternative embodiments of the present invention.

FIG. 5 shows one example of the data conversion system 10 implemented as a method 40 according to alternative embodiments of the present invention. Step 42a of the method 40 includes acquiring samples of low frequency components 17 of the applied analog signal 7 with the first data converter 12 at the first data conversion rate. Step 42b of the method includes acquiring samples of high frequency components 19 of the applied analog signal 7 with the second data converter 14 at the second data conversion rate. Step 44a includes applying the first correction filter to the samples acquired with the first data converter 12, whereas step 44b includes applying the second correction filter to the samples acquired with the second data converter 14. Step 45 includes interpolating between the samples in the digital signal 27 acquired at the first data conversion rate of the ADC 16 to provide a digital signal 29 with an effective data conversion rate equal to that of the second data conversion rate of the ADC 18. Step 46 includes summing the digital signals 29, 27 to provide the output signal 15.

While the embodiments of the present invention have been illustrated in detail, it should be apparent that modifications and adaptations to these embodiments may occur to one skilled in the art without departing from the scope of the present invention as set forth in the following claims.

The invention claimed is:

1. A data conversion method, comprising:
acquiring samples of low frequency signal components of an applied analog signal at a first data conversion rate and samples of high frequency signal components of the applied analog signal at a second data conversion rate that is higher than the first data conversion rate; and
processing the acquired samples of the low frequency signal components of the applied analog signal and the acquired samples of the high frequency signal components of the applied analog signal to provide an output signal that represents the applied analog signal over a frequency range that includes the low frequency signal components and the high frequency signal components of the applied analog signal,
wherein processing the acquired samples of the low frequency signal components of the applied analog signal includes applying a first correction filter to the acquired samples of the low frequency signal components to provide a first signal, and wherein processing the acquired samples of the high frequency signal components of the applied analog signal includes applying a second correction filter to the acquired samples of the high frequency signal components to provide a second signal and summing the first signal and the second signal to provide the output signal, wherein applying the first correction filter includes measuring a first impulse response to an impulse signal applied to a data conversion system input with a first data converter, synthesizing a first finite impulse response filter based on the measured first impulse response, and establishing the first correction filter by a ratio of a frequency response of the first finite impulse response filter to a Fourier Transform of the measured first impulse response.

2. A data conversion method, comprising:

acquiring samples of low frequency signal components of an applied analog signal at a first data conversion rate and samples of high frequency signal components of the applied analog signal at a second data conversion rate that is higher than the first data conversion rate; and processing the acquired samples of the low frequency signal components of the applied analog signal and the acquired samples of the high frequency signal components of the applied analog signal to provide an output signal that represents the applied analog signal over a frequency range that includes the low frequency signal components and the high frequency signal components of the applied analog signal, wherein processing the acquired samples of the low frequency signal components of the applied analog signal includes applying a first correction filter to the acquired samples of the low frequency signal components to provide a first signal, and wherein processing the acquired samples of the high frequency signal components of the applied analog signal includes applying a second correction filter to the acquired samples of the high frequency signal components to provide a second signal and summing the first signal and the second signal to provide the output signal, wherein applying the second correction filter includes measuring a second impulse response to an impulse signal applied to a data conversion system input with a second data converter, synthesizing a second finite impulse response filter based on the measured second impulse response, and establishing the second correction filter by a ratio of a frequency response of the second finite impulse response filter to a Fourier Transform of the measured second impulse response.

3. A data conversion method comprising:

acquiring samples of an applied analog signal in a low frequency signal path at a first data conversion rate;

acquiring samples of the applied analog signal in a high frequency signal path at a second data conversion rate that is higher than the first data conversion rate, wherein the low frequency signal path has a higher characteristic impedance than the high frequency signal path;

applying a first correction filter to the samples of the analog signal acquired in the low frequency signal path to provide a first signal;

applying a second correction filter to the samples of the analog signal acquired in the high frequency signal path to provide a second signal; and summing the first signal with the second signal to provide an output signal representing the applied analog signal, wherein applying the first correction filter includes measuring a first impulse response to an input impulse signal applied to a data conversion system, with a first data converter, synthesizing a first finite impulse response filter based on the measured first impulse response, and establishing the first correction filter by a ratio of a frequency response of the first finite impulse response filter to a Fourier Transform of the measured first impulse response.

4. The data conversion method of claim 3 wherein the first signal is interpolated to provide the samples of the analog signal acquired in the low frequency signal path with a data conversion rate equivalent to the second data conversion rate.

5. The data conversion method of claim 3 wherein applying the first correction filter further includes multiplying a Fourier Transform of the samples of the analog signal acquired in the low frequency signal path with a frequency domain representation of the first correction filter.

6. The data conversion method of claim 3 wherein applying the first correction filter further includes convolving the samples of the analog signal acquired in the low frequency signal path with a time domain representation of the first correction filter.

7. The data conversion method of claim 3 wherein applying the second correction filter includes measuring a second impulse response to the input impulse signal applied to the data conversion system, with a second data converter, synthesizing a second finite impulse response filter based on the measured second impulse response, and establishing the second correction filter by a ratio of a frequency response of the second finite impulse response filter to a Fourier Transform of the measured second impulse response.

8. The data conversion method of claim 7 wherein applying the second correction filter further includes multiplying a Fourier Transform of the samples of the analog signal acquired in the high frequency signal path with a frequency domain representation of the second correction filter.

* * * * *